United States Patent
Lan et al.

(10) Patent No.: US 11,538,510 B2
(45) Date of Patent: Dec. 27, 2022

(54) METHODS OF CHARGING LOCAL INPUT/OUTPUT LINES OF MEMORY DEVICES, AND RELATED DEVICES AND SYSTEMS

(71) Applicant: Micron Technology, Inc., Boise, ID (US)

(72) Inventors: Jin Lan, Kanagawa (JP); Genta Takaya, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/858,370

(22) Filed: Apr. 24, 2020

(65) Prior Publication Data

US 2021/0335402 A1    Oct. 28, 2021

(51) Int. Cl.
*G11C 5/00* (2006.01)
*G11C 7/22* (2006.01)
*G11C 7/12* (2006.01)
*G11C 7/10* (2006.01)

(52) U.S. Cl.
CPC .............. *G11C 7/22* (2013.01); *G11C 7/1048* (2013.01); *G11C 7/12* (2013.01)

(58) Field of Classification Search
CPC ..................................................... G11C 5/005
USPC ................................................. 365/185.25
See application file for complete search history.

(56) References Cited

U.S. PATENT DOCUMENTS

| | | | |
|---|---|---|---|
| 6,172,918 B1 | 1/2001 | Hidaka | |
| 9,530,459 B2 | 12/2016 | Mitsubori et al. | |
| 10,950,277 B1* | 3/2021 | Nobehara | G11C 5/063 |
| 2004/0085841 A1 | 5/2004 | Lim et al. | |
| 2011/0007593 A1 | 1/2011 | Takano | |
| 2011/0205820 A1 | 8/2011 | Takayama et al. | |
| 2015/0179269 A1 | 6/2015 | Lee | |

OTHER PUBLICATIONS

International Search Report for Application No. PCT/US2021/022605, dated Jul. 7, 2021, 3 pages.
Written Opinion of the International Searching Authority for Application No. PCT.US2021/022605, dated Jul. 7, 2021, 5 pages.
Micron, Synchronous Dram, site: www.micron.com/dramds, 256Mb:x32, SDRAM, (2003). 56 pages.
Takano et al., U.S. Appl. No. 16/598,938 titled Methods of Activating Input/Output Lines of Memory Devices, and Related Devices and Systems filed Oct. 10, 2019.

* cited by examiner

*Primary Examiner* — Jason Lappas
(74) *Attorney, Agent, or Firm* — TraskBritt

(57) ABSTRACT

Methods of operating a memory device are disclosed. A method may include receiving a write command, and in response to the write command, performing a write operation without precharging a local input/output line subsequent to receipt of the write command and prior to performing the write operation. Another method may include receiving a read command, performing a read operation in response to the read command, and receiving an additional command without precharging the local input/output line subsequent to performing the read operation and prior to receiving the additional command. Memory devices and systems are also disclosed.

19 Claims, 11 Drawing Sheets

METHODS OF CHARGING LOCAL INPUT/OUTPUT LINES OF MEMORY DEVICES, AND RELATED DEVICES AND SYSTEMS

TECHNICAL FIELD

Embodiments of the disclosure relate generally to memory devices, and more specifically to operating memory devices. Yet more specifically, various embodiments relate to methods of charging local input/output lines of memory devices (e.g., associated with read and write operations), and related devices and systems.

BACKGROUND

Many memory devices include memory cells for storing bits of data. The memory devices may also include various signal-carrying lines for conveying the bits of data to and from the memory cells to and from input/output pins of the memory devices. The memory devices may perform ordered operations using the various signal-carrying lines to convey the data to and from the memory cells (e.g., to and from the input/output pins). Additional background material regarding operations of memory devices can be found in U.S. Publication No. US 2011/007593A1, published Jan. 13, 2011, which is incorporated herein in its entirety.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
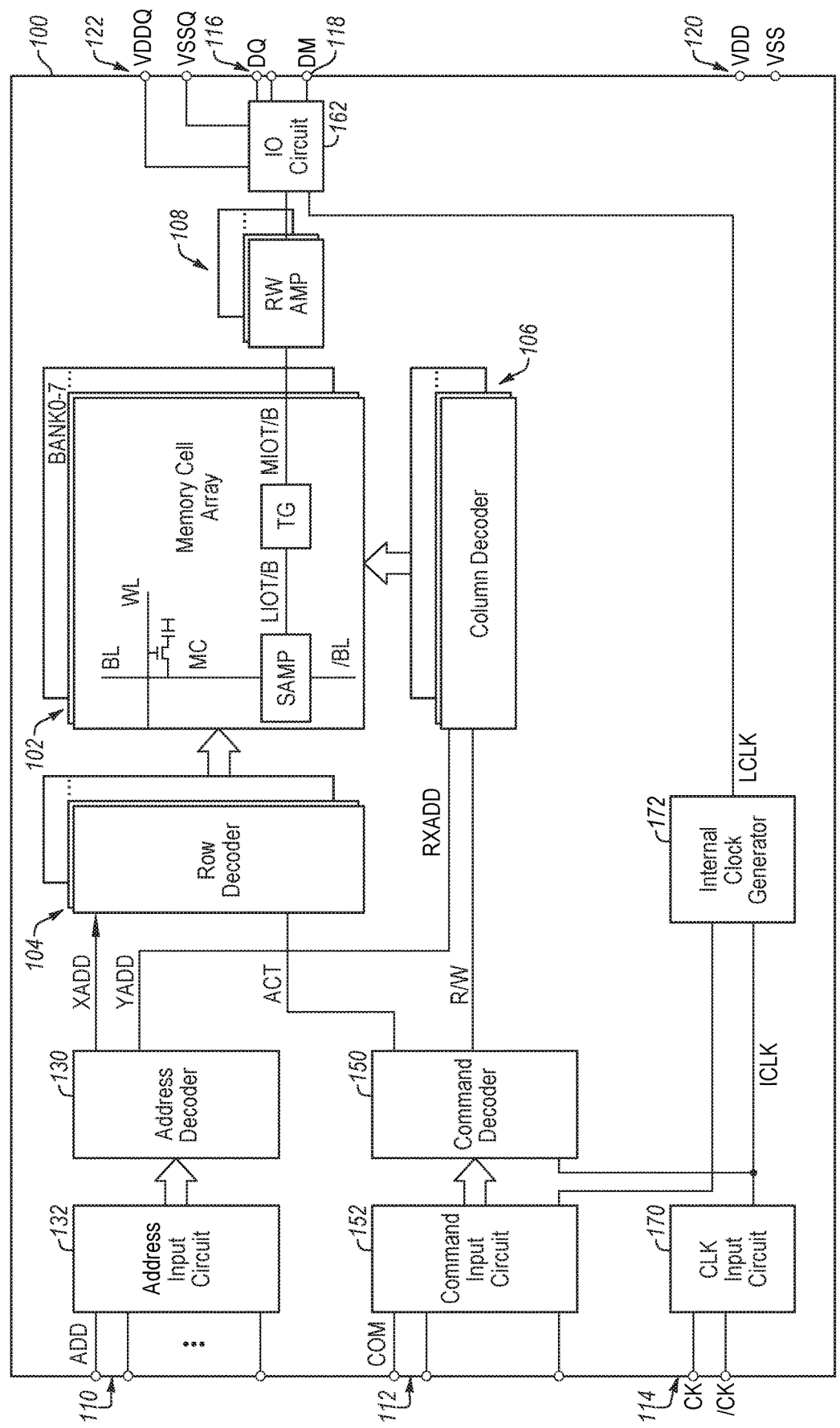
FIG. 1 is a block diagram of an example memory device, according to various embodiments of the present disclosure.

A memory device may be configured to store data as charges in memory cells. The memory device may be configured to access the individual memory cells to write individual bits of the data and/or to read the individual bits. The operations involved in reading data from and/or writing data to the memory cells may include several steps that include connecting and disconnecting various signal-carrying lines of the memory device. For example, an individual memory cell may be accessed by connecting the individual memory cell to a digit line, which may be connected to a local input/output (LIO) line. The LIO line may in turn be connected to a main input/output (MIO) line. The MIO line may be connected to an input/output circuit and/or amplifier, which may be connected to an input/output pin of the memory device. There may be one or more stages of amplification between and/or included in one or more of these connections, wherein the one or more stages of amplification may be configured to convert the charge of the memory cell to a charge appropriate for the input/output pin of the memory device. Additionally, there may be additional lines or switches forming parts of the connections.

As an illustrative example of some of the operations involved in writing a bit of data to a memory cell, a charge corresponding to the bit of data may be received at a MIO line. As a result of a connection between the MIO line and the LIO line, the LIO line may be charged with a charge based on the charge of the MIO line (and/or representative of the bit of data). Further, the LIO line maybe connected to the digit line, and as a result of the connection, the digit line may be charged with a charge based on the charge of the LIO line (and/or representative of the bit of data). Moreover, the digit line may be connected to the memory cell and may transfer a charge based on the charge of the digit line (and/or representative of the bit of data) to the memory cell.

As an illustrative example of some of the operations involved in reading a bit of data from a memory cell, a digit line may be connected to the memory cell. The digit line may receive a charge based on the charge of the memory cell (and/or representative of a bit of data). Further, an LIO line maybe connected to the digit line, and as a result of the connection, the LIO line may be charged with a charge based on the charge of the digit line (and/or representative of the bit of data). As a result of a connection between the MIO line and the LIO line, the MIO line may be charged with a charge based on the charge of the LIO line (and/or representative of the bit of data). Moreover, the MIO line may be configured to transfer a charge (based on the charge of the MIO line and/or representative of the bit of data) to an input/output circuit of the memory device.

To correctly transfer the correct charges, it may be important to charge the various signal-carrying lines with appropriate charges prior to forming the various connections. For example, in some embodiments, if an LIO line is charged with an inappropriate charge prior to being connected to a digit line in a read operation, the LIO line may charge the digit line instead of being charged by the digit line. Such an occurrence may impair the ability of the memory device to read the bits of data.

Embodiments of the present disclosure relate to devices, systems, and methods for charging and/or not charging signal-carrying lines (e.g., LIO lines) as part of performing operations (e.g., read and write operations) on a memory device.

Some embodiments of the present disclosure includes operations associated with writing data (e.g., a single bit of data) to a memory device (e.g., to a single memory cell of the memory device). In at least these embodiments, in response to a write command, an LIO precharge operation may not occur (e.g., precharging of one or more LIO lines may be skipped). For example, operations may include, in response to a write command, connecting a MIO line to an LIO line, connecting the LIO line to a digit line, disconnecting the LIO line from the digit line, and disconnecting the MIO line from the LIO line. In some embodiments, in contrast to other devices, system, and/or methods, the LIO line may not be charged high (e.g., prior to connecting the MIO line to the LIO line). In other words, the LIO line may retain whatever charge it had prior to connecting the MIO line to the LIO line. Other operations for writing data may cause the LIO to be charged high prior to connecting the MIO line to the LIO line.

Other embodiments of the present disclosure include operations associated with reading data (e.g., a single bit of data) from a memory device (e.g., to a single memory cell of the memory device). In at least these embodiments, in response to a read command and subsequent to an associated read operation, an LIO precharge operation may not occur (e.g., a precharging of one or more LIO lines may be skipped). For example, operations include, in response to a read command, connecting an LIO line to a digit line, connecting the LIO line to a MIO line, disconnecting the LIO line from the digit line, and disconnecting the MIO line from the LIO line. In some embodiments, in contrast to other devices, system, and/or methods, the LIO line may not be charged high (e.g., following disconnecting of the LIO line from the digit line). In other words, the LIO line may retain whatever charge it had prior to disconnecting the LIO line from the digit line. Other operations for reading data may cause the LIO to be charged high following the disconnecting of the LIO line from the digit line and/or the disconnecting of the LIO line from the MIO line.

The embodiments of the present disclosure may represent improvements over other operations for reading data from and/or writing data to memory cells at least because the embodiments of the present disclosure may reduce and/or simplify the operations which may conserve power and/or signaling and operational complexity. As a specific example, the LIO line may not be charged high at specific times (e.g., prior to, during, and/or after read and/or write operations), which may conserve power.

FIG. 1 illustrates a block diagram of an example memory device 100, according to various embodiments of the present disclosure. The memory device 100 may include, for example, a DRAM (dynamic random access memory), a SRAM (static random access memory), a SDRAM (synchronous dynamic random access memory), a DDR SDRAM (double data rate SDRAM, such as a DDR4 SDRAM and the like), or a SGRAM (synchronous graphics random access memory). The memory device 100, which may be integrated on a semiconductor chip, may include a memory array 102.

In the embodiment of FIG. 1, the memory array 102 is shown as including eight memory banks BANK0-7. More or fewer banks may be included in the memory array 102 of other embodiments. Each memory bank includes a number of access lines (word lines WL), a number of digit lines (bit lines BL) and /BL, and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. The selection of column-select lines may be performed by the column decoder 106. The column decoder 106 may have access to the address of a column-select line. In some embodiments, the column decoder 106 may not have access to which bit lines to access because the selection of bit lines may be determined by both the word line and the column-select line. In the embodiment of FIG. 1, the row decoder 104 may include a respective row decoder for each memory bank BANK0-7, and the column decoder 106 may include a respective column decoder for each memory bank BANK0-7.

The bit lines BL and /BL are coupled to a respective sense amplifier SAMP. Read data from the bit line BL or /BL may be amplified by the sense amplifier SAMP, and transferred to read/write amplifiers 108 over complementary local data (LIOT/B) lines (also referred to herein as "LIO lines"), transfer gate (TG), and complementary main data lines (MIOT/B) lines (also referred to herein as "MIO lines"). Conversely, write data outputted from the read/write amplifiers 108 may be transferred to the sense amplifier SAMP over the complementary main data lines MIOT/B, the transfer gate TG, and the complementary local data lines LIOT/B, and written in the memory cell MC coupled to the bit line BL or /BL.

The memory device 100 may be generally configured to be receive various inputs (e.g., from an external controller) via various terminals, such as address terminals 110, command terminals 112, clock terminals 114, data terminals 116, and data mask terminals 118. The memory device 100 may include additional terminals such as power supply terminal 120 and power supply terminal 122.

During a contemplated operation, one or more command signals COM, received via the command terminals 112, may be conveyed to a command decoder 150 via a command input circuit 152. The command decoder 150 may include a circuit configured to generate various internal commands via decoding one or more command signals COM. Examples of the internal commands include an active command ACT and a read/write signal R/W.

Further, one or more address signals ADD, received via the address terminals 110, may be conveyed to an address decoder 130 via an address input circuit 132. Address decoder 130 may be configured to supply a row address XADD to the row decoder 104 and a column address YADD to the column decoder 106. Although the command input circuit 152 and the address input circuit 132 are illustrated as separate circuits, in some embodiments, address signals and command signals may be received via a common circuit.

Example commands that may be provided to the memory device 100 may include an active command ACT that may include a pulse signal that is activated in response to a command signal COM indicating row access (e.g., an active command). In response to the active signal ACT accompanying a row address XADD, the row decoder 104 of a specified bank address may be activated. As a result, the word line WL specified by row address XADD may be selected and activated. Additionally, in some embodiments, in response to an active command, LIO lines may be charged (e.g., high).

Additional example commands include read/write commands. A read/write signal R/W may include a pulse signal that is activated in response to a command signal COM indicating column access (e.g., a read command or a write command). In response to the read/write signal R/W accompanying a column address YADD, the column decoder 106 may be activated, and the bit line BL specified by column address YADD may be selected.

Another example command is a precharge command (PRE). A precharge command may include a pulse signal that is activated in response to a command signal COM indicating that a plurality of circuit nodes/lines should be reset to a specified or known voltage level. As a result, the one or more lines may be charged to the specified or known voltage level.

As an example of contemplated operations, in response to an active command ACT, a read signal, a row address XADD, and a column address YADD, data may be read from a memory cell MC specified by the row address XADD and the column address YADD. The read data may be output via the sense amplifier SAMP, the transfer gate TG, the read/write amplifiers 108, an input/output circuit 162, and the data terminals 116. Further, in response to the active command ACT, a write signal, a row address XADD, and a column address YADD, the write data may be supplied to the memory array 102 via the data terminals 116, the input/output circuit 162, the read/write amplifiers 108, the transfer gate TG, and the sense amplifier SAMP. The write data may be written to the memory cell MC specified by the row address XADD and the column address YADD.

Clock signals CK and /CK may be received via the clock terminals 114. A clock input circuit 170 may generate internal clock signals ICLK based on clock signals CK and /CK. Internal clock signals ICLK may be conveyed to various components of the memory device 100, such as the command decoder 150 and an internal clock generator 172. The internal clock generator 172 may generate internal clock signals LCLK, which may be conveyed to the input/output circuit 162 (e.g., for controlling the operation timing of the input/output circuit 162). Further, the data mask terminals 118 may receive one or more data mask signals DM. When data mask signal DM is activated, overwrite of corresponding data may be prohibited.

Figure 2:
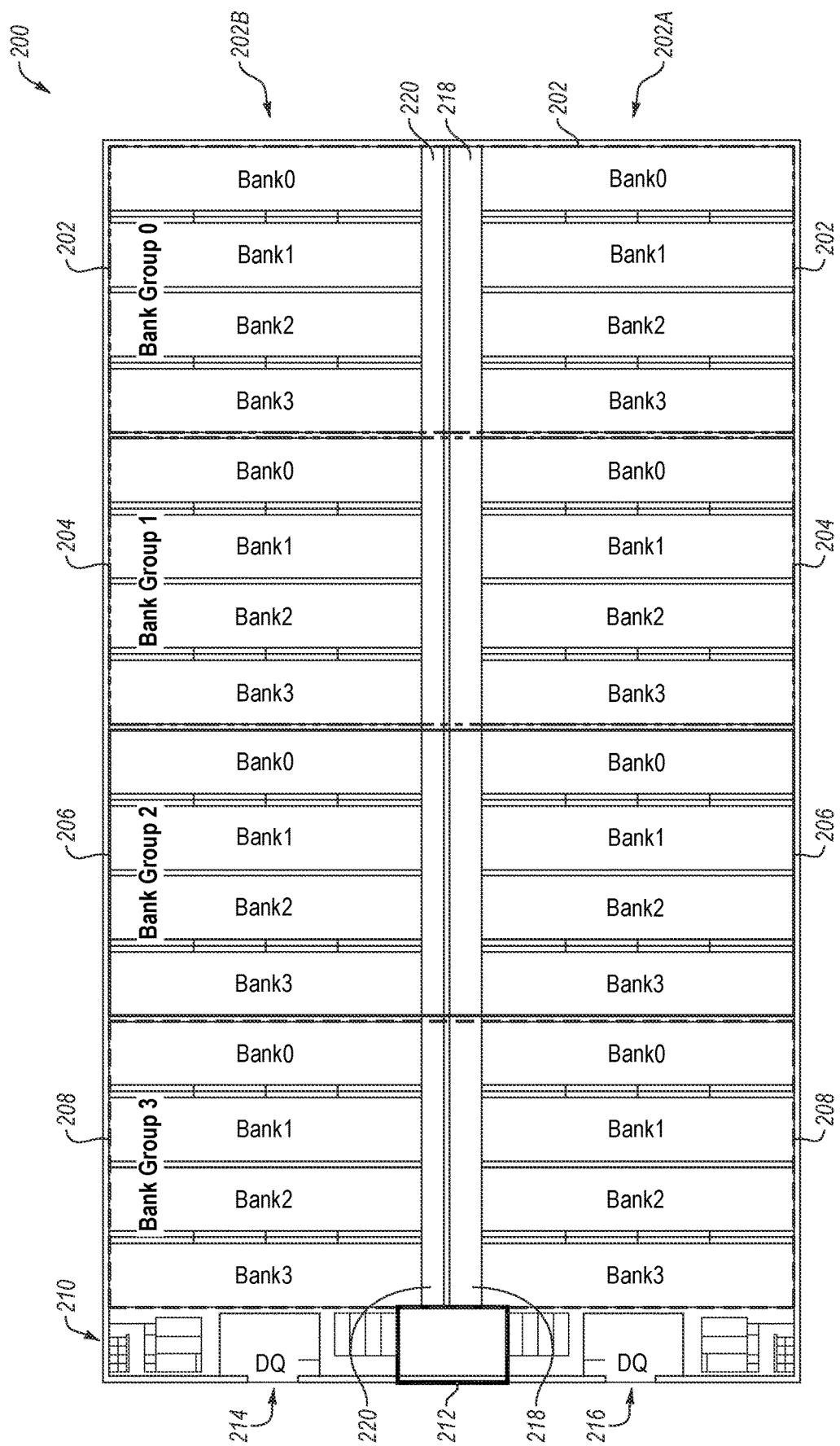
FIG. 2 is another depiction of an example memory device including a number of memory bank groups, according to various embodiments of the present disclosure.

FIG. 2 illustrates an example memory device 200, according to various embodiments of the present disclosure. The memory device 200, which may include, for example a DRAM, includes a number of memory bank groups (i.e., bank group 202 ("Bank Group 0"), bank group 204 ("Bank Group 1"), bank group 206 ("Bank Group 2"), and bank group 208 ("Bank Group 3")), wherein each bank group includes a number of banks (e.g., Bank0, Bank1, Bank2, and Bank3). According to various embodiments, each bank shown in FIG. 2 may include two partial banks (e.g., "half banks" or "portions") that are arranged in regions (e.g., upper and lower regions) of an associated bank group.

More specifically, for example, the bank group 202 incudes a region 202A and a region 202B. In the illustrated example, the region 202A may include a lower region, and the region 202B may include an upper region. Thus, for example, Bank0 of Bank Group 0 includes a portion within the region 202A and a portion within the region 202B. Similarly, as another example, Bank2 of Bank Group 3 includes a portion within the region 202A and a portion within the region 202B.

The memory device 200 further includes control circuitry 210, which may include, for example, command/address/control circuits. Also, the memory device 200 includes command/address (CA) area 212 including one or more CA pads (not shown in FIG. 2). The memory device 200 also includes DQ pads 214 and 216. Further, according to various embodiments, a first portion of each memory bank (e.g., within the region 202A) may be coupled to a first number of DQ pads (e.g., lower DQ pads 216, such as DQ pads 0-7), and a second portion of each memory bank (e.g., within the region 202B) may be coupled to a second number of DQ pads (e.g., upper DQ pads 214, such as DQ pads 8-15).

The memory device 200 further includes other circuits, such as digital sense amplifier (DSA) 218 and logic (e.g., row bank logic) 220. For example, banks within one or more bank groups may share circuitry, such as the DSA 218, the logic 220, and/or error correction code (ECC) circuitry (not shown in FIG. 2).

Figure 3A:
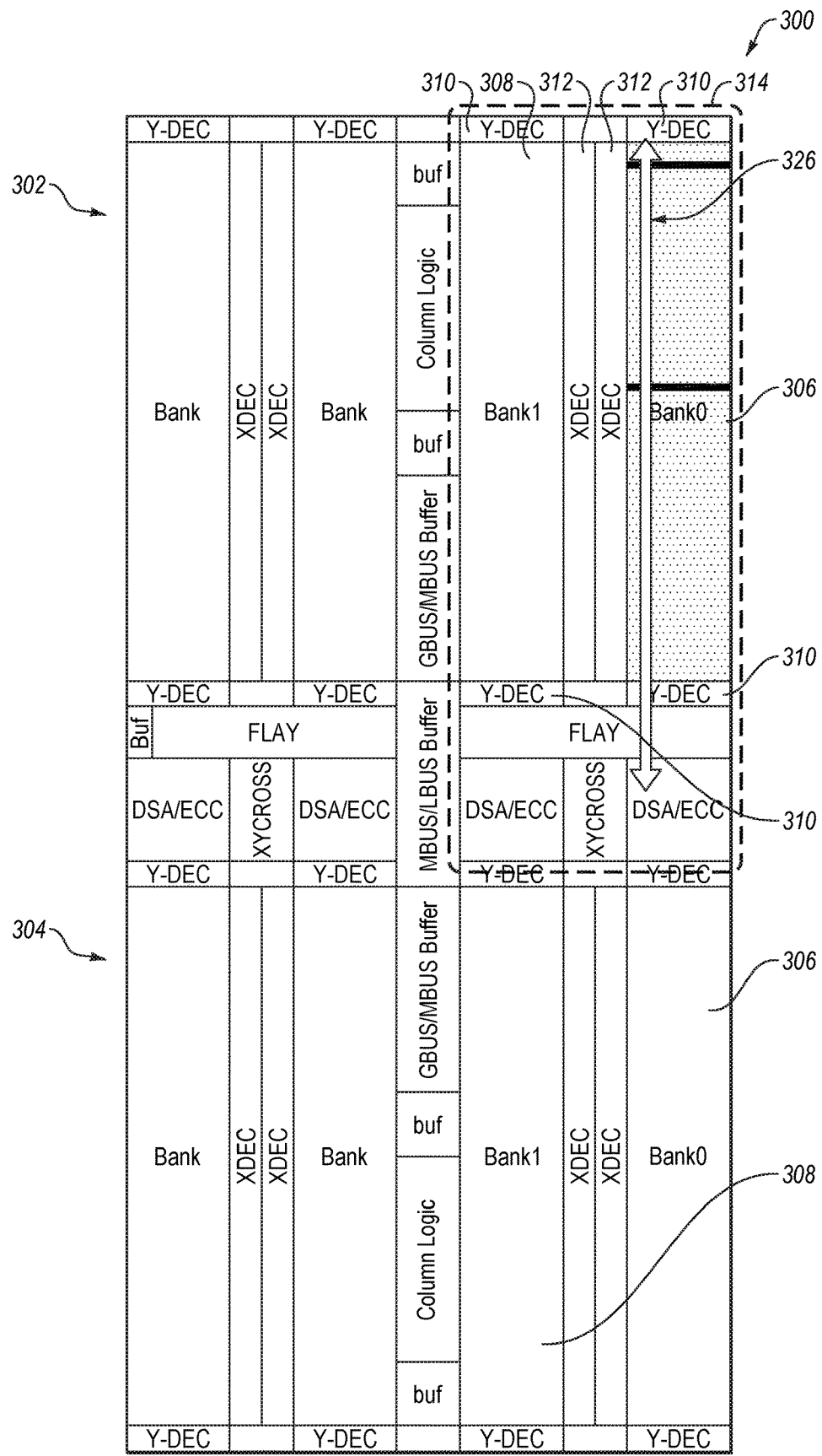
FIG. 3A depicts a portion of an example memory device including a number of bank regions, according to various embodiments of the present disclosure.

FIG. 3A depicts a portion of a memory device 300, in accordance with various embodiments of the present disclosure. The memory device 300 includes a first (e.g., upper) bank region 302 and a second (e.g., lower) bank region 304. Each of the first bank region 302 and the second bank region 304 include a portion of a first bank (i.e., Bank0) 306 and a portion of a second bank (i.e., Bank1) 308. A portion 314 of the memory device 300 that includes the first bank region 302 of the first bank 306 and the second bank 308 is shown in FIG. 3B.

Figure 3B:
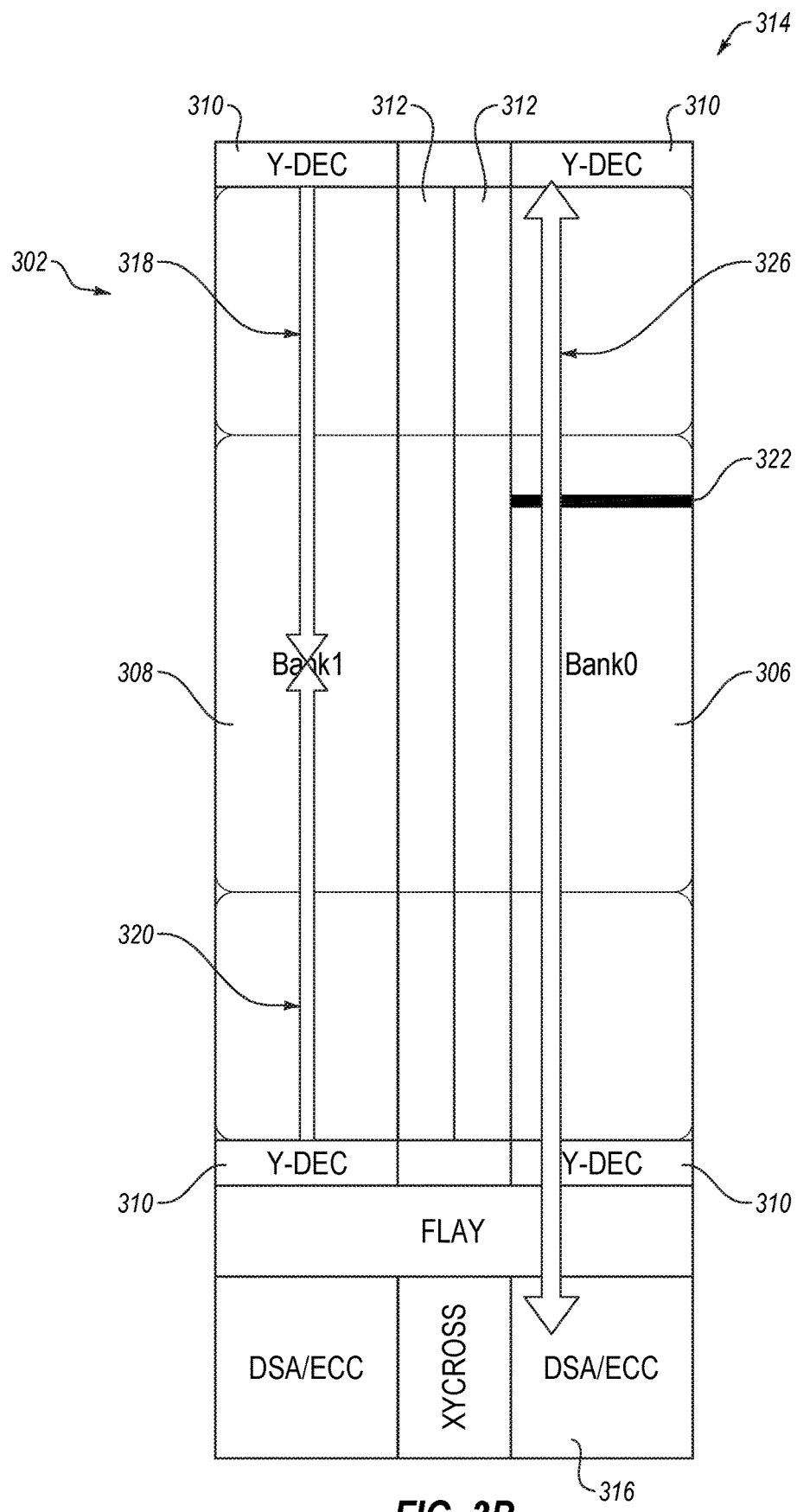
FIG. 3B illustrates a region of an example memory device, in accordance with various embodiments of the present disclosure.

As shown in FIGS. 3A and 3B, the memory device 300 includes column decoders ("Y-DEC") 310 configured to drive a column select (CS) signal from the upper and lower regions. Although in some embodiments, one column decoder may be used, in other embodiments, more than one column decoder (e.g., two column decoders) may be used (e.g., to drive a relatively large load). Further, the memory device 300 includes row decoders 312 positioned between the first bank 306 and the second bank 308.

FIG. 3B further illustrates a column selection line 318, a column selection line 320, and a selected word line 322 (e.g., selected responsive to row addresses).

Figure 3C:
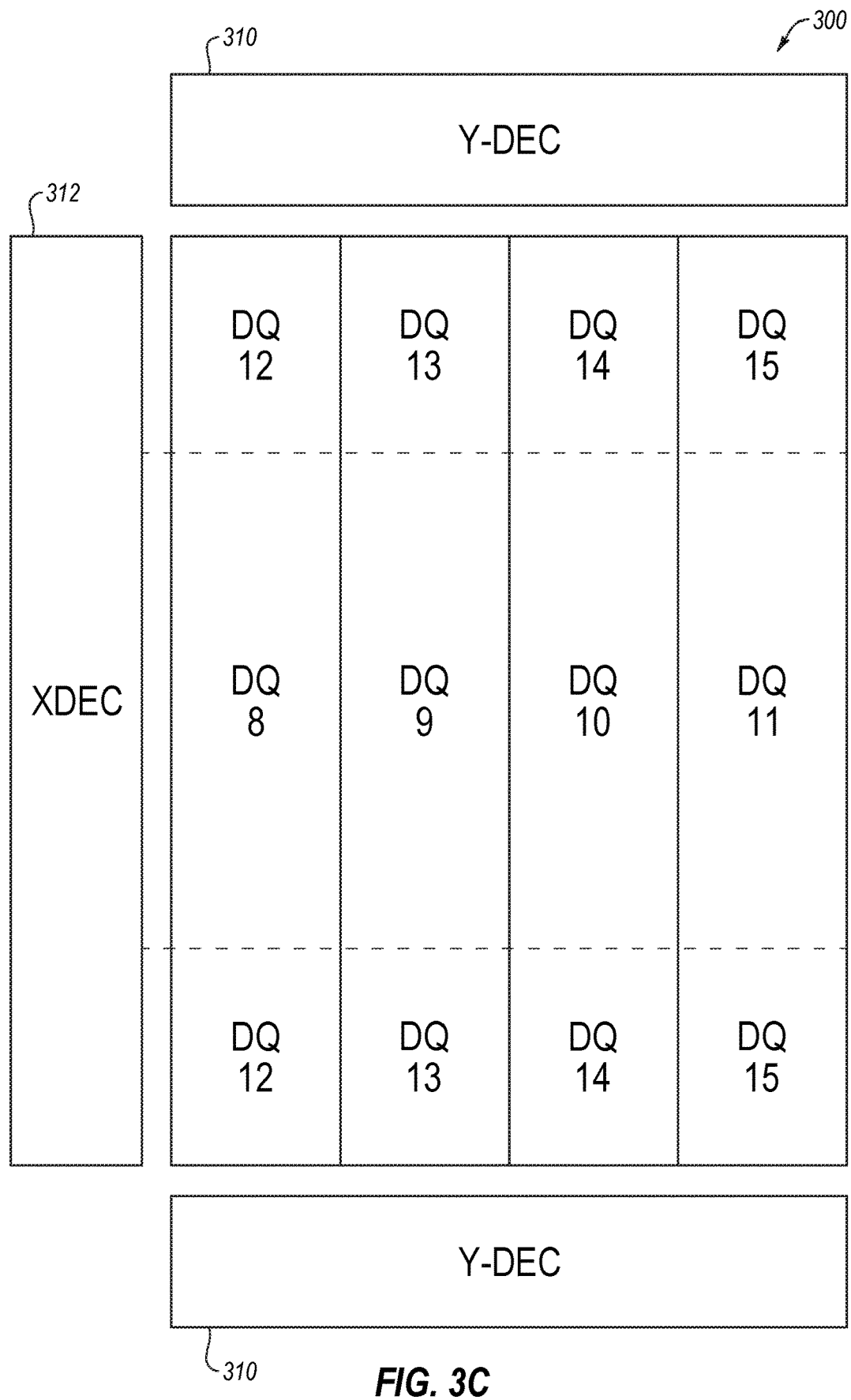
FIG. 3C is another illustration of an example memory device including a number of data terminals of a number of data terminal regions, according to various embodiments of the present disclosure.

FIG. 3C is another illustration of the memory device 300 including a number of data terminals (DQ) of a number of DQ regions. FIG. 3C further depicts the column decoders 310, and the row decoder 312. As shown in FIG. 3C, the memory device 300 includes DQ areas 8-15, wherein each DQ area is associated with a DQ. For example, data transferred to/from a DQ X (e.g., DQ 12; not shown in FIG. 3C) may be stored in DQ X area(s) (e.g., DQ 12 areas shown in FIG. 3C).

As will be appreciated, data (e.g., a bundle of data) may be output from each DQ area via a number of associated MIO lines. More specifically, for example, for each DQ area shown in FIG. 3C, 16 bits of data may be output via 16 MIO lines. For example, in the configuration shown in FIG. 3C, a total of 128 MIO lines (i.e., 16 bits×8 DQ) may be used to transfer 128 read/write data bits. Further, in an embodiment wherein a device (e.g., the memory device 300) is configured for error correction code (ECC), the device may include additional bits (e.g., parity bits).

FIG. 3B further depicts MIO 326. The MIO 326 may also be referred to herein as "a number of MIO lines." In this example, the MIO 326, which may be associated with multiple DQ areas, extends from circuitry 316 through data terminal areas. Although only one MIO is illustrated with respect to FIG. 3B, any number of MIOs may be included. For example, there may be a MIO (or a number of MIO lines) for each of the DQ areas.

FIGS. 4, 5, 6, and 7 show timing diagrams 400, 500, 600, and 700, respectively. The timing diagrams 400, 500, 600, and 700 are illustrative of various example contemplated operations of a memory device (e.g., the memory device 100 of FIG. 1, the memory device 200 of FIG. 2, and/or the memory device 300 of FIGS. 3A-C), according to various embodiments of the present disclosure. It is noted that various signals of the illustrated timing diagrams may not be drawn to scale. In particular, the durations and timing depicted is given as illustrative only and is not limiting.

Further, although illustrated events may or may not line up with clock cycles, the disclosure is not so limited, and varying the timing of events (e.g., relative to other events, including clock cycles) is within the scope of the disclosure.

The various signals of the timing diagrams 400, 500, 600, and 700 may include voltage signals on lines (e.g., I/O lines) and/or pins (e.g., I/O pins) of a memory device. The various signals may have two primary voltage levels, e.g., the signals may approximate a digital signal. The two primary voltage levels may represent a high ("high") level, which may represent a digital "1", and a low ("low") level, which may represent a digital "0." In some embodiments, some of the signals may include a third voltage level, e.g., a level between the high level and the low level. For example, LIO-line signals 414 (see FIG. 4), LIO-line signals 514 (see FIG. 5), LIO-line signals 614 (see FIG. 6), and LIO-line signals 714 (see FIG. 7) include a middle voltage level that is between the high level and the low level.

For example, timing diagram 400 depicts a clock signal 402 (CLK), a command signal 404 (CMD), a write-state signal 406 (WS), a word-line signal 408 (Word), a column-select signal 410 (CS), an equalize signal 412 (EQ), LIO-line signals 414 (LIOT/N), an LIO precharge signal 416 (RP), a read-state signal 418 (RS), and MIO-line signals 420 (MIOT/N).

A clock signal (e.g., a clock signal 402 of FIG. 4), which may include a clock signal input, may be driven by a system clock. For example, input signals received at a memory device may be sampled on the positive edge of the clock signal. Further, for example, one or more counters may be incremented based on the clock signal.

A command signal (e.g., a command signal 404 of FIG. 4) may include one or more signals that may, individually, or in combination represent a command. For example, the command signal may include a read command, a write command, an active command, and/or a precharge command. Contemplated operations of a memory device (e.g., at least some of the contemplated operations described with regard to FIGS. 4-7) may be directed by a command signal (e.g., the command signal 404). For example, the memory device may be instructed to read a value from or write a value to a memory cell at an identified row and column via the command signal.

A write-state signal (e.g., a write-state signal 406 of FIG. 4) represents a signal indicative of a connection between one or more MIO lines and one or more LIO lines. In some embodiments, the write-state signal may represent an instruction to connect the one or more MIO lines with the one or more LIO lines. For example, the write-state signal may indicate that one or more MIO lines (associated with one or more memory cells identified by a command of the command signal) are to be connected with one or more LIO lines (associated with the one or more identified memory cells) (e.g., by a TG). Additionally, the write-state signal may indicate that charge may be transferred from the one or more MIO lines to the one or more LIO lines, and not from the one or more LIO lines to the one or more MIO lines. In some embodiments, the write-state signal may allow charge (e.g., a charge representative of data) to be transferred from the one or more MIO lines to the one or more LIO lines. For example, the write-state signal 406 may control the operation of one or more switches (e.g., transistors) to allow or prevent transfer of charge from the MIO lines to the LIO lines. Referring, for illustrative purposes, to the timing diagram 400 of FIG. 4, at a time 432, the write-state signal 406 is high, and the LIO-line signals 414 may be charged by the MIO-line signals 420.

A word-line signal (e.g., a word-line signal 408 of FIG. 4) represents a signal (e.g., a representative voltage) on a word line (e.g., the selected word line 322 or the selected word line 324 of FIGS. 3A-C). When the word-line signal is high, memory cells associated with the word line are activated and their charges are transferred to corresponding digit lines (e.g., the bit line BL of FIG. 1).

A column-select signal (e.g., a column-select signal 410 of FIG. 4) represents a signal indicative of a connection between one or more LIO lines and their corresponding sense amplifier (e.g., sense amplifier SAMP of FIG. 1). In some embodiments, the column-select signal may represent an instruction to connect the one or more LIO lines to their corresponding sense amplifiers. For example, the column-select signal may indicate that one or more LIO lines (associated with the one or more identified memory cells) are to be connected to their associated sense amplifiers.

In general, in a write operation, connecting an LIO line to a sense amplifier may cause a digit line (and consequently one or more memory cells) to take a charge representative of a value based on a charge of the LIO line. For example, the LIO line may be charged high. The sense amplifier, when connecting the LIO line to the digit line, may charge the digit line high based on the high charge of the LIO line. A corresponding word line being high may allow the charge of the digit line to charge a memory cell. The charge of the memory cell may be based on, but be a different voltage than, the charge of the LIO line. For example, when high, the LIO line may be charged with a charge on the order of 1 volt, and a capacitor in a memory cell, when high, may hold a charge of 200 millivolts. Referring, for illustrative purposes, to the timing diagram 400, at or around a time 434, the column-select signal 410 is high and the write-state signal 406 is high. The column-select signal 410 and the write-state signal 406 being high may indicate that one or more digit lines (and consequently one or more memory cells) may receive a charge from (and/or based on a charge of) the one or more LIO lines.

In general, in a read operation, connecting an LIO line to a sense amplifier may cause the LIO line to take a charge representative of a value stored in the memory cell. For example, the memory cell may hold a "1" value. The sense amplifier, when connecting a digit line corresponding to the memory cell to the LIO line, may charge the LIO line high, representative of the "1" value of the memory cell. Referring, for illustrative purposes, to the timing diagram 400, at or around a time 442, the column-select signal 410 is high and the read-state signal 418 is high. The column-select signal 410 being high and the read-state signal 418 being low may indicate that one or more LIO lines may receive a charge based on a charge of one or more of the memory cells.

An equalize signal (e.g., equalize signal 412 of FIG. 4) represents a signal indicating that digit lines and/or LIO lines are to be charged to a voltage level that is between high and low. In some embodiments, the equalize signal may represent an instruction to charge the digit lines and/or the LIO lines to the voltage level. Referring, for illustrative purposes to the timing diagram 400, before a time 424, the equalize signal 412 is high. This may be representative of an instruction to keep the LIO-line signals 414 (and/or a digit line (not shown)) at a voltage level between high and low.

LIO-line signals (e.g., the LIO-line signals 414 of FIG. 4) represent a pair of signals (e.g., a representative voltage or voltage differential) on a pair of LIO lines. The LIO-line signals may be used as part of a connection to transfer charges to and from memory cells. In particular, the LIO-line signals may provide a connection between a sense amplifier and a MIO line. The LIO-line signals may, at times, be governed by connections made between the LIO lines and a digit line (through a sense amplifier) (e.g., when reading e.g., at the time 442 of FIG. 4) or a pair of MIO lines (through a TG) (e.g., when writing e.g., at the time 434). Alternatively, at times, LIO-line signals may be governed by an LIO precharge operation, e.g., indicated by an LIO precharge signal (e.g., LIO precharge signal 416 at a time 426; see FIG. 4). Alternatively, at times, the LIO-line signals may be governed by an LIO charge operation e.g., indicated by the equalize signal (e.g., at a time prior to the time 424 of FIG. 4).

An LIO precharge signal (e.g., an LIO precharge signal 416 of FIG. 4) represents a signal indicating that the LIO lines are to be precharged to a specific voltage (or voltage differential) level. In some embodiments, the LIO precharge signal may represent an instruction to charge the LIO lines to the level. Referring, for illustrative purposes to the timing diagram 400, at the time 426, the LIO precharge signal 416 may be set high. This may cause the LIO-line signals 414 to be charged high starting at the time 426. It is worth noting that the set LIO precharge signal 416 is separate from a precharge command, e.g., precharge command 448.

A read-state signal (e.g. a read-state signal 418) represents a signal indicative of a connection between one or more MIO lines and one or more LIO lines. In some embodiments, the read-state signal may represent an instruction to connect the one or more MIO lines with the one or more LIO lines. For example, the read-state signal may indicate that one or more MIO lines (associated with one or more memory cells identified by a command of the command signal) are to be connected with one or more LIO lines (associated with the one or more identified memory cells) (e.g., by a TG). Additionally, the read-state signal may indicate that charge may be transferred from the one or more LIO lines to the one or more MIO lines, and not from the one or more MIO lines to the one or more LIO lines. In some embodiments, the read-state signal may allow charge (e.g., representative of data) to be transferred from the one or more LIO lines to the one or more MIO lines. For example, the read-state signal 418 may control the operation of one or more switches (e.g., transistors) to allow or prevent transfer of charge from the LIO lines to the MIO lines.

The connection between the one or more MIO lines and the one or more LIO lines may allow a charge to be transferred from the one or more LIO lines to the one or more MIO lines. Referring, for illustrative purposes, to the timing diagram 400, at or around a time 444, the read-state signal 418 is high, and the MIO-line signals 420 may be charged by the LIO-line signals 414.

MIO-line signals (e.g., the MIO-line signals 420 of FIG. 4) represent a pair of signals (e.g., representative voltage or voltage differential) on a pair of MIO lines (e.g., the MIO 326 of FIGS. 3A-C). The MIO-line signals may be used as part of a connection to transfer charges to and/or from memory cells. In particular, the MIO-line signals may provide a connection between an LIO line and a data amplifier (e.g., the read/write amplifiers 108 of FIG. 1).

Contemplated example operations will now be discussed with regard to FIG. 4. The contemplated operations described with regard to FIG. 4 may be performed relative to a command system that is configured to receive a series of three commands: an active command (e.g., active command 422), followed by one or more read and/or write commands (e.g., write command 428 and read command 438), followed by a precharge command (e.g., precharge command 448).

Figure 4:
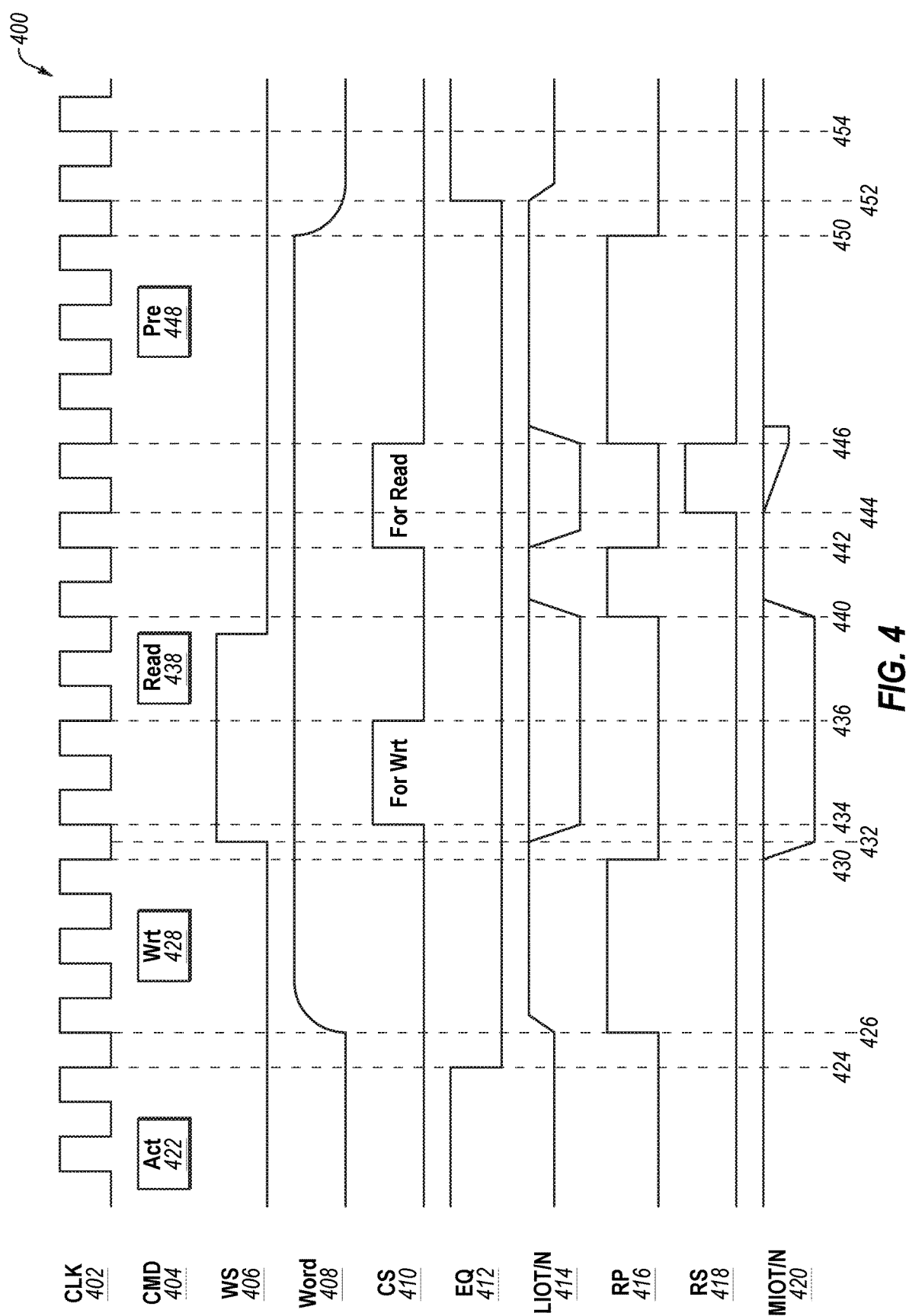
FIG. 4 shows a timing diagram including various signals associated with a memory device, according to various embodiments of the present disclosure.

The contemplated operations described with regard to FIG. 4 begin with an active command 422 (Act) received at a memory device (e.g., memory device 100 of FIG. 1). The memory device may be configured to perform one or more operations in response to the active command 422. Specifically, the memory device may be configured to prepare for a read or write command, e.g., by charging one or more lines to appropriate voltages.

At the time 424, in response to the active command 422, the equalize signal 412 may be set low. The equalize signal 412 being low may allow the LIO-line signals 414, which were formerly at a value between high and low, to be charged high in response to another signal.

At the time 426, in response to the active command 422, the LIO precharge signal 416 may be set high. In response to the LIO precharge signal 416 being set high at the time 426, the LIO-line signals 414 may be charged high beginning at the time 426. Additionally, at the time 426, in response to the active command 422, the word-line signal 408 may be charged high.

In the example operations described with regard to FIG. 4, the active command 422 results in the LIO precharge signal 416 being set high at the time 426 and the LIO-line signals 414 being charged high beginning at the time 426 regardless of which operation (read or write) is to follow the active command 422. This may be in contrast with the operations described below with regard to FIG. 5.

In the example operations described with regard to FIG. 4, a write command 428 (Wrt) follows the active command 422. The memory device may be configured to interpret the write command 428 as an instruction to write a value identified by the write command 428 to each memory cell identified by the write command 428. A particular identified memory cell may be associated with a particular LIO line and a particular MIO line. The LIO-line signals 414 may represent a pair of signals on the particular LIO line and the MIO-line signals 420 may represent a pair of signals on the particular MIO line. In response to the write command 428, the memory device may undertake one or more operations to set a voltage of each of the identified memory cells to a level corresponding to the identified values.

At a time 430, in response to the write command 428, the LIO precharge signal 416 may be set low. As a result of the LIO precharge signal 416 being low, the LIO-line signals 414 may be charged to another voltage lever (other than high).

At the time 432, in response to the write command 428, the write-state signal 406 may be set high. As described above, the write-state signal 406 being high may indicate a connection between one or more MIO lines and one or more LIO lines, e.g., the particular MIO line represented by the MIO-line signals 420 and the particular LIO line represented by the LIO-line signals 414. Thus, beginning at the time 432, the LIO-line signals 414 may receive a charge from the MIO-line signals 420.

At the time 434, which may follow one or more of the write command 428, the time 430, and/or the time 432 by an appropriate amount of time (e.g., to allow the LIO-line signals 414 to charge), in response to the write command 428, the column-select signal 410 may be set high. As described above, the column-select signal 410 being set high may indicate a connection between a particular sense amplifier (related to a particular digit line which is related to a particular memory cell identified by the write command 428) and the particular LIO line. The connection of the particular sense amplifier to the particular LIO line may result in a charge being set on the digit line, which may in turn set a charge on the particular memory cell. Thus, the particular memory cell may have been written to in response to the write command 428. Accordingly, between the time 432 and a time 436, an operation (i.e., a write operation) is performed.

At the time 436, which may follow one or more of the write command 428, the time 430, the time 432, and the time 434 by an appropriate duration of time (e.g., to allow the digit line and/or the memory cell to be charged), the column-select signal 410 may be set low. The column-select signal 410 being low may indicate a disconnection between the particular LIO line and the corresponding sense amplifier.

In the example operations described with regard to FIG. 4, a read command 438 (Read) follows the write command 428. The memory device may be configured to interpret the read command 438 as an instruction to read a value from an identified memory cell. The identified memory cell may be associated with a particular LIO line and a particular MIO line. The LIO-line signals 414 may depict a pair of signals on the particular LIO line and the MIO-line signals 420 may depict a pair of signals on the particular MIO line.

At a time 440, in response to the read command 438, and to prepare for the reading of the value of the identified memory cell, the LIO precharge signal 416 may be set high. In response to the LIO precharge signal 416 being high, the LIO-line signals 414 may be charged high. The LIO-line signals 414 may be charged high to prepare the LIO-line signals 414 to receive a voltage from a sense amplifier associated with the identified memory cell.

At a time 442, in response to the read command 438, the LIO precharge signal 416 may be set low. The LIO precharge signal 416 being low may allow the LIO-line signals 414 to be charged to a new voltage level.

Additionally, at the time 442, in response to the read command 438, the column-select signal 410 may be set high. As before, the column-select signal 410 being set high may cause the particular LIO to be connected to the particular sense amplifier. Thus, the LIO-line signals 414 may receive a voltage indicative of the value stored at the identified memory cell, starting at the time 442. Accordingly, between the time 442 and a time 446, an operation (i.e., a read operation) is performed.

At a time 444, which may follow the read command 438 and/or the time 442 by an appropriate amount of time (e.g., to allow the LIO lines to charge), the read-state signal 418 may be set high. The read-state signal 418 being set high may indicate that the particular MIO line is to be connected to the particular LIO line. Thus, the MIO-line signals 420 may receive a signal from the LIO-line signals 414.

At a time 446, which may follow the time 444 by an appropriate amount of time (e.g., to allow the particular MIO line to charge), the read-state signal 418 may be set low, the column-select signal 410 may be set low, and the LIO precharge signal 416 may be set high. The read-state signal 418 being set low may cause the particular MIO lines to be disconnected from the particular LIO lines. The column-select signal 410 being set low may cause the particular LIO lines to be disconnected from the particular sense amplifier. And, the LIO precharge signal 416 being set high may cause the LIO-line signals 414 to be charged high.

In the example operations described with regard to FIG. 4, a precharge command 448 (Pre) follows the read command 438. The memory device may be configured to perform one or more operations in response to the precharge command 448. Specifically, the memory device may be configured to charge one or more circuit nodes/lines to an appropriate voltage e.g., the memory device may be configured to return one or more signals to their state prior to the active command 422.

At a time 450, in response to the precharge command 448, the word-line signal 408 may begin to discharge. Additionally, at the time 450, in response to the precharge command 448, the LIO precharge signal 416 may be set low. The LIO precharge signal 416 being set low may allow the LIO-line signals 414 to be at a voltage other than high.

At a time 452, in response to the precharge command 448, the equalize signal 412 may be set high. The equalize signal 412 being set high may cause the LIO-line signals 414 to be set to a voltage level between high and low.

Thus, as a result of the precharge command 448, at a time 454, the levels of each of the signals of the timing diagram 400 may have returned to their respective states prior to the time 424.

Figure 5:
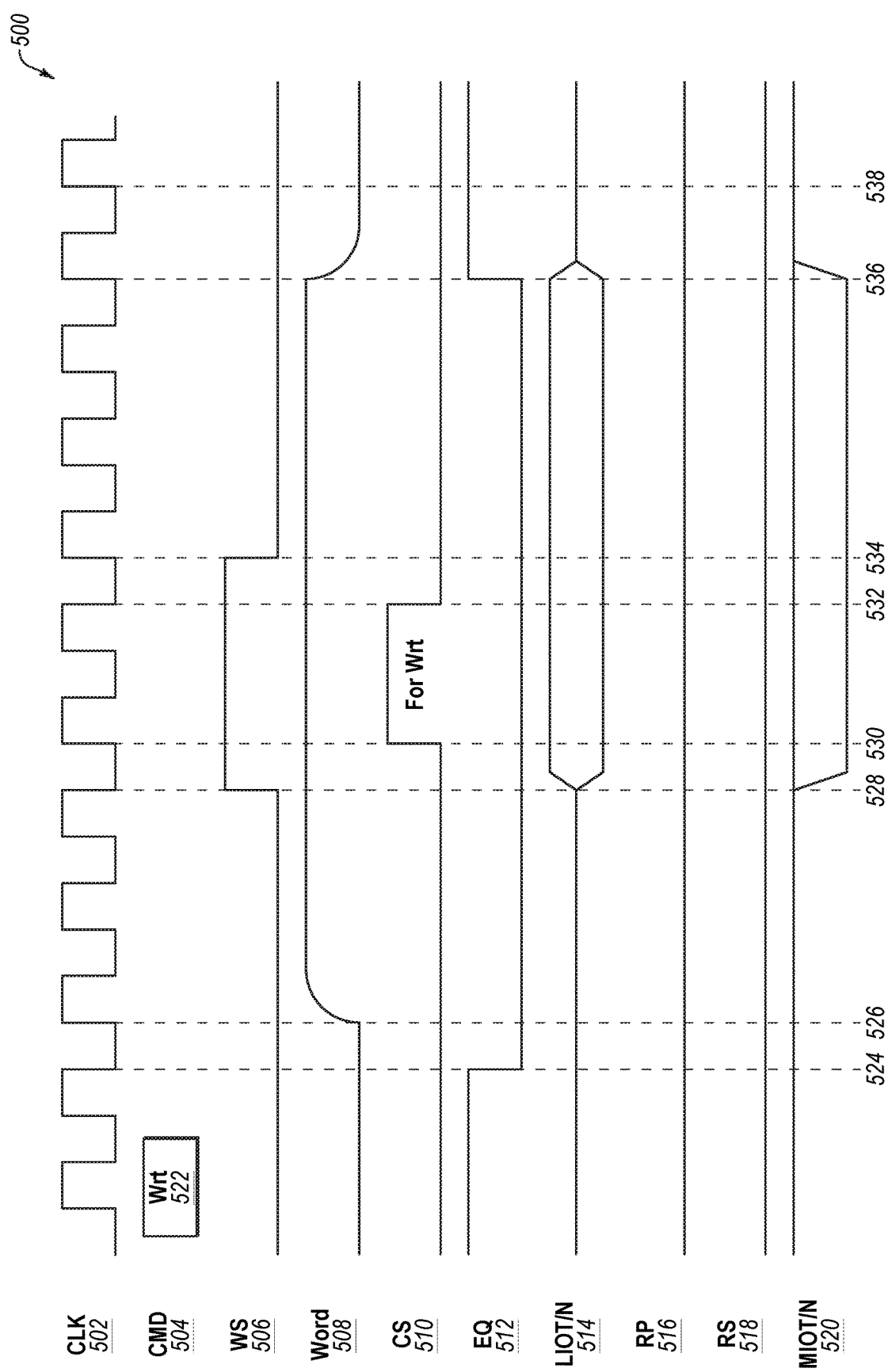
FIG. 5 shows another timing diagram including various signals associated with a memory device, according to various embodiments of the present disclosure.

As mentioned above, the command system described with regard to the operations of FIG. 4 may be configured to perform read and/or write operations in response to a series of three commands: an active command, one or more read and/or write commands, and a precharge command. In contrast, the operations described with regard to FIG. 5 may be performed with regard to a command system that may be configured to perform read or write operations in response to a single read or write command. The operations described with regard to FIG. 5 may include operations that may be similar, but not identical, to the operations described as occurring in response to the active command 422 and the precharge command 448 despite the operations described with regard to FIG. 5 not including an active command and a precharge command. The operations described with regard to FIG. 5, including the operations that are similar to the operations described as occurring in response to the active command 422 and the precharge command 448 may differ from the operations described with regard to FIG. 4 in one or more respects. As a specific example, as will be appreciated by a person having ordinary skill in the art, in the operations related to timing diagram 400 of FIG. 4, an LIO precharge operation occurs (i.e., LIO precharge signal 416 is set high and/or the LIO-line signals 414 are charged high) in response to the active command 422 and/or preceding the write command 428. In contrast, according to various embodiments of the present disclosure (e.g., as shown in FIG. 5), precharging of the LIO may not occur (e.g., be omitted) preceding or in response to a write command. In other words, it may not be required to set LIO precharge signal 416 high and/or to charge the LIO-line signals 414 in preparation for and/or in response to a write command Thus, the operations described with regard to FIG. 5 may be an improvement over the operations described with regard to FIG. 4.

For example, FIG. 5 shows a timing diagram 500, according to various embodiments of the present disclosure. The example set of contemplated operations given with regard to FIG. 5 may be an alternative to the example operations described above with regard to FIG. 4. More specifically, the contemplated operations described with regard to FIG. 5 may be an improvement over the contemplated operations described with regard to FIG. 4 in one or more respects. For example, the operations described with regard to FIG. 5 may require less power than the operations described with regard to FIG. 4. Additionally, the operations described with regard to FIG. 5 may be simpler and/or require less logic and/or pins or lines to implement than the operations described with regard to FIG. 4.

The timing diagram 500 includes a clock signal 502, a command signal 504, a write-state signal 506, a word-line signal 508, a column-select signal 510, an equalize signal 512, LIO-line signals 514, an LIO precharge signal 516, a read-state signal 518, and MIO-line signals 520.

The operations described with regard to FIG. 5 may begin with a write command 522 (Wrt) received at a memory device (e.g., memory device 100 of FIG. 1). The memory device may be configured to interpret the write command 522 as an instruction to write one or more values (e.g., a series of values) identified by the write command 522 to each memory cell of the memory device identified by the write command 522. A particular identified memory cell may be associated with a particular LIO line and a particular MIO line. The LIO-line signals 514 may represent a pair of signals on the particular LIO line and the MIO-line signals 520 may represent a pair of signals on the particular MIO line. In response to the write command 522, the memory device may undertake one or more operations to set a voltage of each of the identified memory cells to a level corresponding to the identified values.

In contrast to the operations described with regard to FIG. 4, the operations described with regard to FIG. 5 begin with the command 522 and not the active command 422. It is worth noting that in the both the operations the operations described with regard to FIG. 4 and the operations described with regard to FIG. 5, the word-line signal 408 and the word-line signal 508 are both charged high and the equalize signal 412 and the equalize signal 512 are both set low. The word-line signal 408 and the word-line signal 508 being charged high and the equalize signal 412 and the equalize signal 512 being set low may prepare the various lines of the memory device (e.g., the word line and the particular LIO line) for a read operation or a write operation that may follow. In the operations described with regard to FIG. 4, the LIO precharge signal 416 may be set high causing the LIO-line signals 414 to be charged high. Charging the LIO line high may prepare the various lines of the memory device (e.g., the particular LIO line) for a read operation. However, the LIO precharge signal 416 being set high and the LIO-line signals 414 being charged high may be unnecessary for a write operation. As such, in the operations described with regard to FIG. 5, the LIO precharge signal 516 may not be set high and the LIO line may not be charged high (e.g., at the time 526) prior to the write operation (i.e., prior to at least connecting the MIO line to the LIO line). Not setting the set LIO precharge signal 516 high and charging the LIO-line signals 514 at the time 526 (e.g., prior to performing the write operation) may be an improvement of the operations described with regard to FIG. 5 compared to the operations described with regard to FIG. 4.

More specifically, in response to the write command 522, at a time 524, the equalize signal 512 may be set low. The equalize signal 512 being low may allow the LIO-line signals 514 to receive a high or low voltage level. Prior to the time 524, the equalize signal 512 being high may cause the LIO-line signals 514 to be at a voltage level between high and low. In response to the write command 522, at a time 526, the word-line signal 508 may begin to charge.

At a time 528, the write-state signal 506 may be set high. The write-state signal 506 being high may indicate that a particular MIO line may be connected to a particular LIO line. Additionally, the write-state signal 506 may indicate that the particular LIO line is to accept a charge of the particular MIO line. The MIO-line signals 520 may represent a voltage signal on the particular MIO line and the LIO-line signals 514 may represent a voltage signal on the particular LIO line. Beginning at or about the time 528, the connection between the MIO-line signals 520 and the LIO-line signals 514 may result in the LIO-line signals 514 receiving a charge from the MIO-line signals 520.

At a time 530, which may follow the write command 522 and/or the time 528 by an appropriate amount of time (e.g., during which the particular LIO line charges), the column-select signal 510 may be set high. The column-select signal 510 being high may indicate a connection between the particular LIO line and a corresponding sense amplifier (which may be connected to a digit line corresponding to the memory cell identified in the write command 522). The connection between the particular LIO line and the corresponding sense amplifier may cause the digit line to be charged with a charge corresponding to the charge of the LIO line (which, as a result of the connection between the particular MIO line and the particular LIO line, corresponds to the charge of the MIO line). As a result of the word-line signal 508 being high, the identified memory cell may receive the charge of the digit line. Thus, the identified memory cell may be written to. Accordingly, between the time 530 and a time 532, an operation (i.e., a write operation) is performed.

At the time 532, which may follow one or more of the write command 522, the time 528, and the time 530, the column-select signal 510 may be set low. In some embodiments, according to the command system related to the operations described with regard to FIG. 5, the write command 522 may not be followed by additional write commands after the time 532 and before the time 538 and the CS signal 510 may be set low for a duration e.g., until the LIO-line signals 514 finishes charging. The column-select signal 510 being low may indicate a disconnection between the particular LIO line and the corresponding sense amplifier.

At a time 534, which may follow one or more of the write command 522, the time 528, the time 530, and the time 532, the write-state signal 506 may be set low. In some embodiments, according to the command system related to the operations described with regard to FIG. 5, the write command 522 may not be followed by additional read or write commands after the time 532 and before the time 538, and write-state signal 506 may be set high between the time 528 and the time 534 which may indicate a connection between the particular MIO line and the particular LIO line. The write-state signal 506 being low (e.g., after the time 534) may indicate a disconnection between the particular MIO line and the particular LIO line.

At a time 536, which may follow the write command 522, the equalize signal 512 may be set high. The equalize signal 512 being set high may cause the LIO-line signals 514 to be set to a voltage level between high and low.

Additionally, at or around the time 536, the word-line signal 508 may discharge, and the MIO-line signals 520 may be charged high. Thus, by a time 538, the levels of each of the signals of the timing diagram 500 may have returned to their respective states prior to the time 524.

In contrast to the operations described with regard to FIG. 4, the operations described with regard to FIG. 5, begin with a write command 522 (Wrt) and not an active command. Referring back to the operations described with regard to FIG. 4, as described above, at time 426, in response to the active command 422, the LIO precharge signal 416 is set high, resulting in the LIO-line signals 414 being charged.

Further, the LIO precharge signal 416 is set high and the LIO-line signals 414 are charged regardless of whether a read operation or a write operation follows the active command 422. In the case of the operations described with regard to FIG. 4, the write command 428 follows the active command 422. In this case, the LIO-line signals 414 may be charged by the MIO-line signals 420 at the time 432. This charging may overwrite the previous charge on the LIO-line signals 414. As such, it may not be necessary to charge the LIO-line signals 414 prior to a write operation. However, in the case of a read command, it may be important to charge the LIO-line signals 414 prior to connecting the LIO lines the sense amplifier. An example of charging the LIO prior to a read operation is given in the operations described with regard to FIG. 4 at the time 440.

In contrast to the operations described with regard to FIG. 4 in which the LIO-line signals 414 is charged at the time 426, in the operations described with regard to FIG. 5, the LIO precharge signal 516 is not set high prior to the time 528. At the time 528, the write-state signal 506 is set high and the LIO-line signals 514 is charged by the MIO-line signals 520.

Additionally, in contrast to the operations described with regard to FIG. 4, the operations described with regard to FIG. 5 may not include a precharge command. Specifically, with regard to the operations described with regard to FIG. 5, by the time 538, the levels of each of the signals of the timing diagram 500 have returned to their respective states prior to the time 524 without receiving a precharge command. Further, in response to the write command 522, and by the time 538, the levels of each of the signals of the timing diagram 500 have returned to their respective states prior to the time 524 without the need of a precharge command.

Thus, the operations described with regard to FIG. 5, may be an improvement over the operations described with regard to FIG. 4 at least because the LIO is not precharged and one or more commands are omitted, either or both of which may conserve power, time, and/or simplify operations of a memory device.

Figure 6:
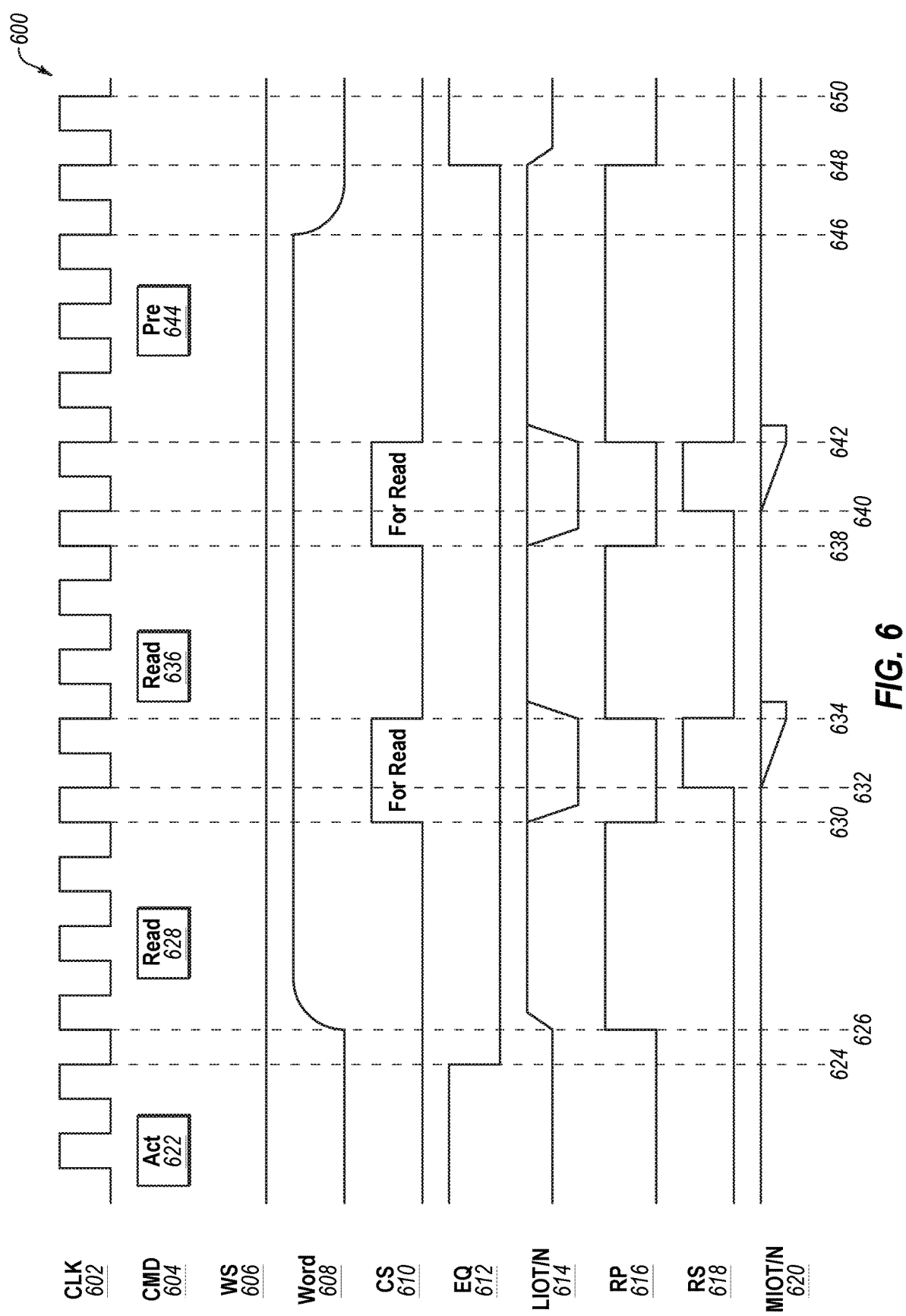
FIG. 6 shows another timing diagram including various signals associated with a memory device, according to various embodiments of the present disclosure.

FIG. 6 shows a timing diagram 600. The timing diagram 600 is illustrative of one or more example operations of a memory device (e.g., the memory device 100 of FIG. 1, the memory device 200 of FIG. 2, and/or the memory device 300 of FIGS. 3A-C).

The timing diagram 600 includes a clock signal 602, a command signal 604, a write-state signal 606, a word-line signal 608, a column-select signal 610, an equalize signal 612, LIO-line signals 614, an LIO precharge signal 616, a read-state signal 618, and MIO-line signals 620.

Contemplated operations will now be described with regard to FIG. 6. The contemplated operations described with regard to FIG. 6 may be performed relative to a command system that is similar to the command system described with regard to FIG. 4 in that the command system may be configured to receive a series of three commands: an active command (e.g., active command 622), followed by one or more read and/or write commands (e.g., read command 628 and read command 636), followed by a precharge command (e.g., precharge command 644).

The contemplated operations begin with an active command 622 (Act). A memory device may be configured to respond to the active command 622 by preparing to read a data value from a memory cell or to write data to the memory cell. For example, the memory device may be configured to charge one or more circuit lines and/or pins in preparation to read or write data to the memory cell.

At a time 624, in response to the active command 622, the equalize signal 612 may be set low. The equalize signal 612 being low may allow the LIO-line signals 614, which were formerly in between high and low, to go high when charged in response to another signal.

At a time 626, in response to the active command 622, the LIO precharge signal 616 may be set high. In response to the LIO precharge signal 616 being set high at the time 626, the LIO-line signals 614 may be charged high beginning at the time 626. Additionally, at the time 626, in response to the active command 622, the word-line signal 608 may be charged high.

In the example operations described with regard to FIG. 6, a read command 628 (Read) follows the active command 622. The memory device may be configured to interpret the read command 628 as an instruction to read a value from an identified memory cell. The identified memory cell may be associated with a particular LIO line and a particular MIO line. The LIO-line signals 614 may depict a pair of signals on the particular LIO line and the MIO-line signals 620 may depict a pair of signals on the particular MIO line.

At a time 630, in response to the read command 628, the LIO precharge signal 616 may be set low. The LIO precharge signal 616 being low may allow the LIO-line signals 614 to be charged to a new voltage level.

Additionally, at the time 630, in response to the read command 628, the column-select signal 610 may be set high. The column-select signal 610 being set high may cause the particular LIO to be connected to the particular sense amplifier. Thus, the LIO-line signals 614 may receive a voltage indicative of the value stored at the identified memory cell, starting at the time 630. Accordingly, between the time 630 and a time 634, an operation (i.e., a read operation) is performed.

At a time 632, which may follow the read command 628 and/or the time 630 by an appropriate amount of time (e.g., to allow the LIO lines to charge), the read-state signal 618 may be set high. The read-state signal 618 being set high may indicate that the particular MIO line is to be connected to the particular LIO line. Thus, the MIO-line signals 620 may receive a signal from the LIO-line signals 614.

At the time 634, which may follow the time 632 by an appropriate amount of time (e.g., to allow the particular MIO line to charge), the read-state signal 618 may be set low, the column-select signal 610 may be set low, and the LIO precharge signal 616 may be set high. The read-state signal 618 being set low may cause the particular MIO lines to be disconnected from the particular LIO lines. The column-select signal 610 being set low may cause the particular LIO lines to be disconnected from the particular sense amplifier. And, the LIO precharge signal 616 being set high may cause the LIO-line signals 614 to be charged high.

The LIO-line signals 614 may be charged high (in response to the LIO precharge signal 616 being set high) in preparation for a next operation, specifically, in case the next command is a read command. It is worth noting that the state of the signals of the timing diagram 600 shortly after the time 634 (e.g., after the LIO-line signals 614 and the MIO-line signals 620 have finished charging) is the same as the state of the signals shortly after the time 626. In particular, in response to the LIO precharge signal 616 being set high, at the conclusion of the operations associated with the read command 628, the signals returned to the same state that the signal were in following the active command 622.

In the example operations described with regard to FIG. 6, a read command 636 (Read) follows the read command 628. The operations and signaling at a time 638 may be the same as the operations and signaling at the time 630. Additionally, the operations and signaling at a time 640 may be the same as the operations and signaling at the time 632. Additionally, the operations and signaling at a time 642 may be the same as the operations and signaling at the time 634.

In the example operations described with regard to FIG. 6, a precharge command 644 (Pre) follows the read command 636. The memory device may be configured to perform one or more operations in response to the precharge command 644. Specifically, the memory device may be configured to prepare for a read or write command, e.g., by charging one or more lines to an appropriate voltage.

At a time 646, in response to the precharge command 644, the word-line signal 608 may begin to discharge. At a time 648, in response to the precharge command 644, the LIO precharge signal 616 may be set low. The LIO precharge signal 616 being set low may allow the LIO-line signals 614 to be at a voltage other than high. At a time 650, in response to the precharge command 644, the equalize signal 612 may be set high. The equalize signal 612 being set high may cause the LIO-line signals 614 to be set to a voltage level between high and low. Thus, as a result of the precharge command 644, at a time 650, the levels of each of the signals of the timing diagram 600 may have returned to their respective states prior to the time 624.

As mentioned above, the command system described with regard to the operations of FIG. 6 may be configured to perform read and/or write operations in response to a series of three commands: an active command, one or more read and/or write commands, and a precharge command. In contrast, the operations described with regard to FIG. 7 may be performed with regard to a command system that may be configured to perform read or write operations in response to a single read or write command. The operations described with regard to FIG. 7 may include operations that may be similar, but not identical, to the operations described as occurring in response to the active command 622 and the precharge command 644 despite the operations described with regard to FIG. 7 not including an active command and a precharge command. The operations described with regard to FIG. 7, including the operations that are similar to the operations described as occurring in response to the active command 622 and the precharge command 644 may differ from the operations described with regard to FIG. 6 in one or more respects.

Figure 7:
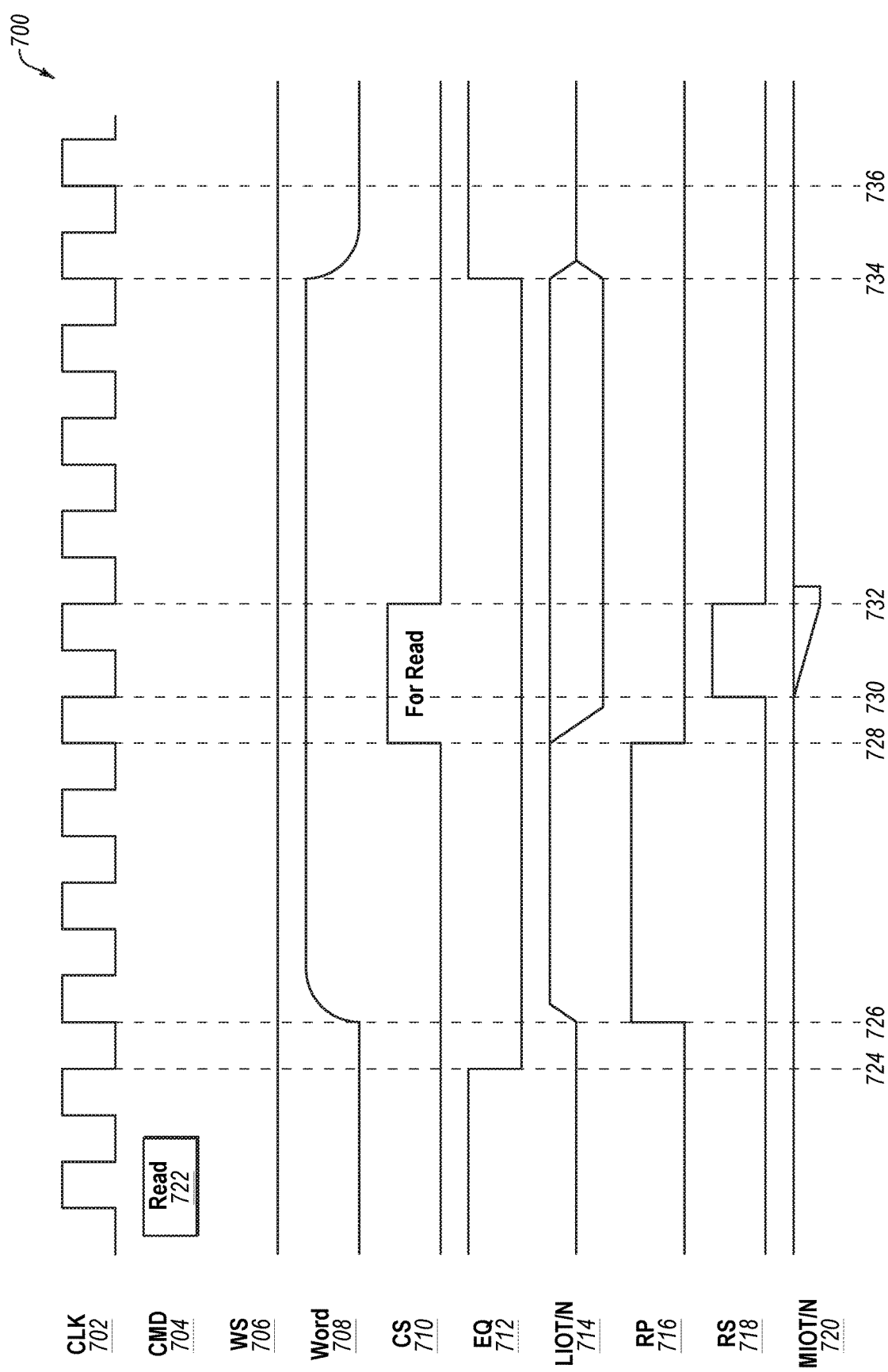
FIG. 7 shows yet another timing diagram including various signals associated with a memory device, according to various embodiments of the present disclosure.

As a specific example, as will be appreciated by a person having ordinary skill in the art, in the embodiments related to timing diagram 600 of FIG. 6, an LIO precharge operation occurs (i.e., the LIO precharge signal 616 is set high, and/or the LIO-line signals 614 is charged high) after a read operation and prior to receipt of another command and/or performance of another operation. In contrast, according to various embodiments of the present disclosure (e.g., as shown in FIG. 7), an LIO precharge operation may not occur (e.g., may be omitted) after a read operation and prior to receipt of another command (e.g., a read or write command) and/or performance of another operation. Thus, the operations described with regard to FIG. 7 may be an improvement over the operations described with regard to FIG. 6.

For example, FIG. 7 shows a timing diagram 700, according to various embodiments of the present disclosure. An example set of contemplated operations described with regard to FIG. 7 may be an alternative to the example operations described above with regard to FIG. 6. More specifically, the contemplated operations described with regard to FIG. 7 may be an improvement over the contemplated operations described with regard to FIG. 6 in one or more respects. For example, the operations described with regard to FIG. 7 may require less power than the operations described with regard to FIG. 6. Additionally, the operations described with regard to FIG. 7 may be simpler and/or require less logic, pins and/or lines to implement than the operations described with regard to FIG. 6.

The timing diagram 700 includes a clock signal 702, a command signal 704, a write-state signal 706, a word-line signal 708, a column-select signal 710, an equalize signal 712, LIO-line signals 714, an LIO precharge signal 716, a read-state signal 718, and MIO-line signals 720.

In contrast to the operations described with regard to FIG. 6, the operations described with regard to FIG. 7 may not include an active command. The operations described with regard to FIG. 7 may begin with a read command 722. The memory device may be configured to interpret the read command 722 as an instruction to read a value from an identified memory cell. The identified memory cell may be associated with a particular LIO line and a particular MIO line. The LIO-line signals 714 may depict a pair of signals on the particular LIO line and the MIO-line signals 720 may depict a pair of signals on the particular MIO line.

At a time 724, in response to the read command 722, the equalize signal 712 may be set low. The equalize signal 712 being low may allow the LIO-line signals 714, which were formerly in between high and low, to be charged in response to another signal.

At a time 726, in response to the read command 722, the LIO precharge signal 716 may be set high. In response to the LIO precharge signal 716 being set high at the time 726, the LIO-line signals 714 may be charged high beginning at the time 726. Additionally, at the time 726, in response to the read command 722, the word-line signal 708 may be charged high.

At a time 728, in response to the read command 722, the LIO precharge signal 716 may be set low. The LIO precharge signal 716 being low may allow the LIO-line signals 714 to be charged to a new voltage level.

Additionally, at the time 728, in response to the read command 722, the column-select signal 710 may be set high. The column-select signal 710 being set high may cause the particular LIO to be connected to the particular sense amplifier. Thus, the LIO-line signals 714 may receive a voltage indicative of the value stored at the identified memory cell, starting at the time 728.

At a time 730, which may follow the read command 722 and/or the time 728 by an appropriate amount of time (e.g., to allow the LIO lines to charge), the read-state signal 718 may be set high. The read-state signal 718 being set high may indicate that the particular MIO line is to be connected to the particular LIO line. Thus, the MIO-line signals 720 may receive a signal from the LIO-line signals 714.

At a time 732, which may follow the time 730 by an appropriate amount of time (e.g., to allow the particular MIO line to charge), the read-state signal 718 may be set low and the column-select signal 710 may be set low. The read-state signal 718 being set low may cause the particular MIO lines to be disconnected from the particular LIO lines. The column-select signal 710 being set low may cause the particular LIO lines to be disconnected from the particular sense amplifier.

In contrast to the operations described with regard to FIG. 6, at the time 732, the LIO precharge signal 716 may not be set high. Thus, the LIO-line signals 714 may not return to the high level as LIO-line signals 614 did in the operations described with regard to FIG. 6. Thus, the LIO-line signals 714 may hold the voltage level indicative of the value of the memory cell for a duration of time.

At a time 734, the equalize signal 712 may be set high. The equalize signal 712 being set high may cause the LIO-line signals 714 to be set to a voltage level between high and low.

Additionally, at or around the time 734, the word-line signal 708 may discharge. Thus, by a time 736, the levels of each of the signals of the timing diagram 700 may have returned to their respective states prior to the time 724.

In contrast to the operations described with regard to FIG. 6, the operations described with regard to FIG. 7 begin with a read command 722 and not an active command. In the operations described with regard to FIG. 7, at the time 726, the LIO precharge signal 716 may be set high. This is similar to the operations described with regard to FIG. 6, in which, at the time 626, the LIO precharge signal 616 is set high. One difference being that in the operations described with regard to FIG. 7, the LIO precharge signal 716 is set high in response to the read command 722, whereas in the operations described with regard to FIG. 6, the LIO precharge signal 616 is set high in response to the active command 622.

Additionally, in the operations described with regard to FIG. 6, following the read-state signal 618 and the column-select signal 610 being high (indicating the connection of the sense amplifier to the LIO line and the LIO line to the MIO line), at the time 634, the LIO precharge signal 616 is set high and the LIO-line signals 614 is charged to prepare in case the next operation to be performed is another read operation. In contrast, in the operations described with regard to FIG. 7, following the read-state signal 718 and the column-select signal 710 being high, at the time 732, the LIO precharge signal 716 is not set high and the LIO-line signals 714 are allowed to retain their charge.

In the case of the operations described with regard to FIG. 7, if another read command is received by the memory device, the LIO precharge signal 716 may be set high (and the LIO-line signals 714 charged) in response to the other read command. And, in the case of the operations described with regard to FIG. 7, if a write command were to be received by the memory device, the LIO-line signals 714 may not be precharged prior to the connection of the LIO line to the MIO line. Thus, in the operations described with regard to FIG. 7, the LIO-line signals 714 may not need to be charged high following the read operation in response to the read command 722. Not setting the LIO precharge signal 716 high following the operations in response to the read command 722 may reduce and/or simplify operations and/or conserve power.

Additionally, in contrast to the operations described with regard to FIG. 6, the operations described with regard to FIG. 7 may not include a precharge command following the read operation. Specifically, following the operations described with regard to FIG. 7, by the time 736, the levels of each of the signals of the timing diagram 700 have returned to their respective states prior to the time 724 without receiving a precharge command. In the operations described with regard to FIG. 7, in response to the read command 722, and by the time 736, the levels of each of the signals of the timing diagram 700 have returned to their respective states prior to the time 724 without the need of a precharge command.

Thus, the operations described with regard to FIG. 7 may be an improvement over the operations described with regard to FIG. 6 at least because the LIO is not precharged needlessly (e.g., at the time 732) which may conserve power, time, and/or simplify operations of a memory device.

Figure 8:
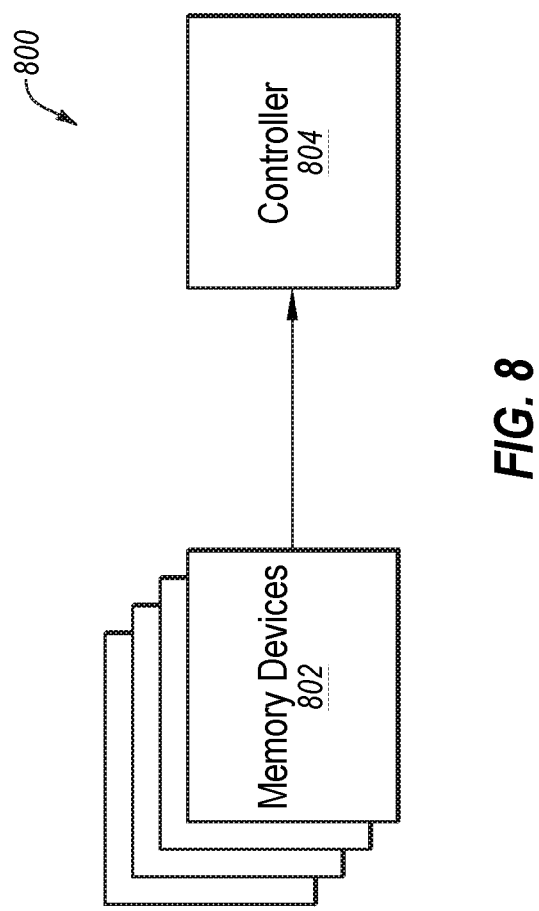
FIG. 8 is a simplified block diagram of an example memory device, according to various embodiments of the present disclosure.

FIG. 8 is a simplified block diagram of a memory system 800 implemented according to one or more embodiments described herein. Memory system 800, which may include, for example, a semiconductor device, includes a number of memory devices 802 and a controller 804. For example, at least one of the memory devices 802 may be configured to carry out various embodiments disclosed herein. Controller 804 may be operatively coupled with memory devices 802 so as to convey command/address signals (e.g., command/address signals received by the command terminals 112 and/or the address terminals 110 of FIG. 1) to memory devices 802.

An electronic system is also disclosed. According to various embodiments, the electronic system may include a memory device including a number of memory dies, each memory die having an array of memory cells. Each memory cell may include an access transistor and a storage element operably coupled with the access transistor.

Figure 9:
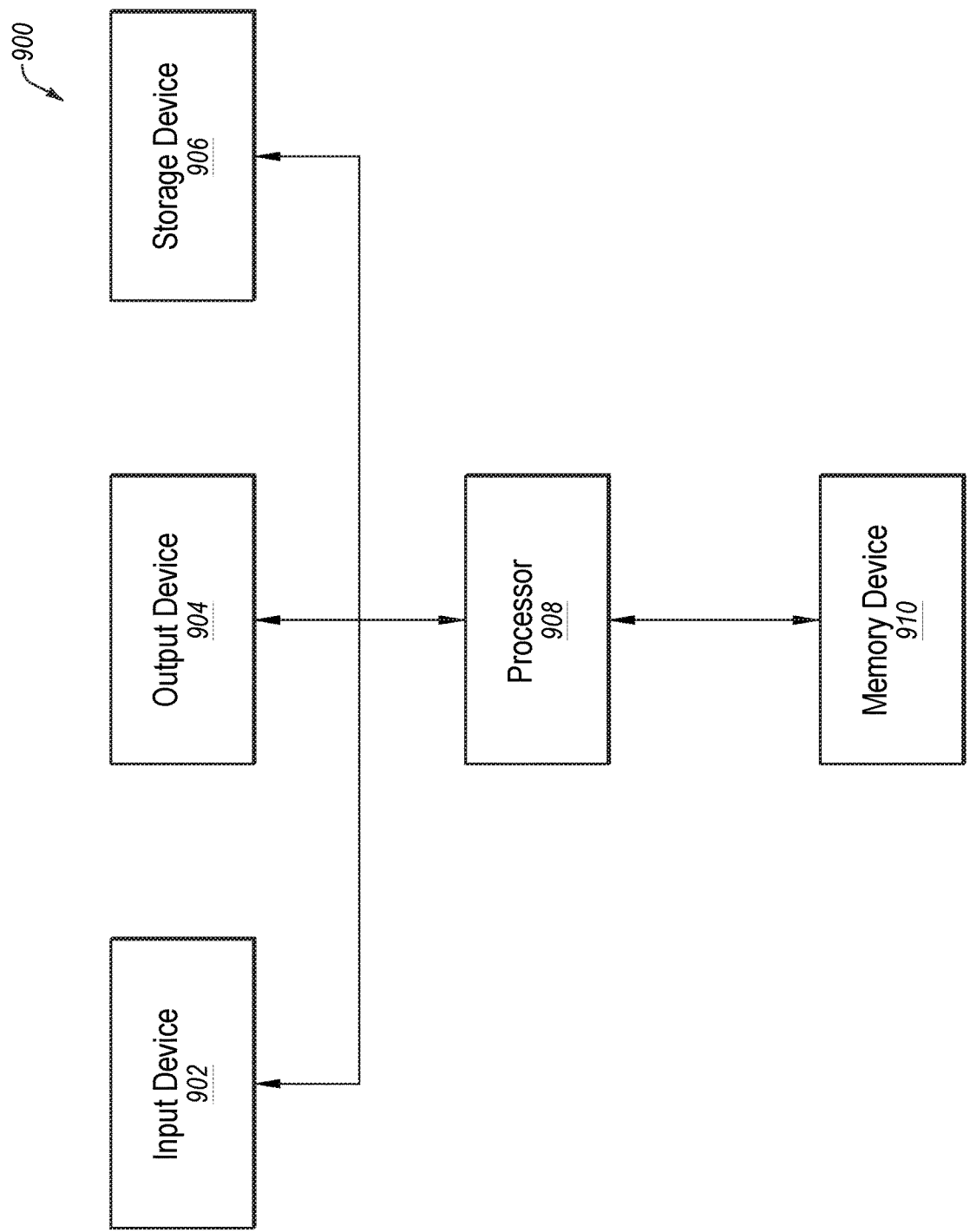
FIG. 9 is a simplified block diagram of an example electronic system, according to various embodiments of the present disclosure.

FIG. 9 is a simplified block diagram of an electronic system 900 implemented according to one or more embodiments described herein. Electronic system 900 includes at least one input device 902, which may include, for example, a keyboard, a mouse, or a touch screen. Electronic system 900 further includes at least one output device 904, such as a monitor, a touch screen, or a speaker. Input device 902 and output device 904 are not necessarily separable from one another. Electronic system 900 further includes a storage device 906. Input device 902, output device 904, and storage device 906 may be coupled to a processor 908. Electronic system 900 further includes a memory device 910 coupled to processor 908. Memory device 910 may include, or may be part of, memory system 800 of FIG. 8. Electronic system 900 may include, for example, a computing, processing, industrial, or consumer product. For example, without limitation, electronic system 900 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Some embodiments of the present disclosure include methods of operating a memory device. One method may include receiving a write command. The method may also include in response to the write command, performing a write operation without performing an LIO precharge operation subsequent to receipt of the write command and prior to performing the write operation. The LIO precharge operation may include charging an LIO line to a predetermined voltage, e.g., high.

In other embodiments, a method may include receiving a read command. The method may also include performing a read operation in response to the read command. The method may also include receiving an additional command without performing an LIO precharge operation subsequent to performing the read operation and prior to receiving the additional command.

Some embodiments of the present disclosure may include a memory device. The memory device may include circuitry. The circuitry may be configured to receive a write command and perform a write operation in response thereto without performing an LIO precharge operation subsequent to receipt of the write command and prior to performing the write operation. Additionally or alternatively, the circuitry may be configured to receive a read command, perform a read operation, and receive an additional command without performing an LIO precharge operation subsequent to performing the read operation and prior to receiving the additional command.

Some embodiments of the present disclosure may include a system. The system may include at least one input device, at least one output device, at least one processor device operably coupled to the input device and the output device, and at least one memory device operably coupled to the at least one processor device. The at least one memory device may include circuitry. The circuitry may be configured to receive a write command. Additionally, the circuitry may be configured to perform a write operation in response to the write command, wherein an LIO line is not precharged after receipt the write command and prior to the write operation. Additionally, the circuitry may be configured to receive a read command. Additionally, the circuitry may be configured to perform a read operation in response to the read command. Additionally, the circuitry may be configured to receive an additional command, wherein the LIO line is not precharged after the read operation and prior to receipt the additional command.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method of operating a memory device, comprising:
   receiving a write command; and
   in response to the write command:
      connecting a main input/output (MIO) line to a local input/output (LIO) line to charge the LIO line based on a charge of the MIO line, the LIO line having a charge between high and low immediately prior to connecting the MIO line to the LIO line; and
      holding an LIO precharge signal low prior to connecting a MIO line to a LIO line, wherein the memory device is configured to interpret the LIO precharge signal as an indication to charge the LIO line high.

2. The method of claim 1, further comprising, in response to the write command:
   connecting the LIO line to a digit line to charge the digit line based on a charge of the LIO line, the digit line coupled to a memory cell of the memory device;
   disconnecting the LIO line from the digit line; and
   disconnecting the MIO line from the LIO line.

3. The method of claim 2, further comprising, in response to the write command, charging the LIO line with a charge between high and low after disconnecting the MIO line from the LIO line.

4. The method of claim 2, further comprising:
allowing the LIO line to retain a charge between high and low prior to connecting the MIO line to the LIO line;
charging the LIO line based on the charge of the MIO line, during, and for a duration of time following, the connection of the MIO line to the LIO line; and
charging the LIO line with a charge between high and low, following the duration of time.

5. The method of claim 2, further comprising:
in response to the write command:
setting an equalize-control signal low prior to connecting the MIO line to the LIO line, wherein the memory device is configured to interpret the equalize-control signal as an indication of whether the LIO line is to be charged with a charge between high and low;
setting a write-state signal high, wherein the memory device is configured to interpret the write-state signal as an indication of whether the MIO line is to be connected to the LIO line;
setting a column-select signal high, wherein the memory device is configured to interpret the column-select signal as an indication of whether the LIO line is to be connected to the digit line;
setting the column-select signal low;
setting the write-state signal low; and
setting the equalize-control signal high.

6. The method of claim 2, further comprising:
in response to the write command:
charging a word line; and
discharging the word line.

7. A method of operating a memory device, comprising:
receiving a write command; and
in response to the write command:
connecting a main input/output (MIO) line to a local input/output (LIO) line to charge the LIO line based on a charge of the MIO line,
setting an equalize-control signal low prior to connecting the MIO line to the LIO line, wherein the memory device is configured to interpret the equalize-control signal as an indication of whether the LIO line is to be charged with a charge between high and low; and
setting the equalize-control signal high after disconnecting the MIO line from the LIO line.

8. The method of claim 7, further comprising allowing the LIO line to retain a charge between high and low between setting the equalize-control signal low and connecting the MIO line to the LIO line.

9. A method of operating a memory device, comprising:
receiving a write command;
in response to the write command:
connecting a main input/output (MIO) line to a local input/output (LIO) line to charge the LIO line based on a charge of the MIO line, the LIO line having a charge between high and low immediately prior to connecting the MIO line to the LIO line; and
holding an LIO precharge signal low prior to connecting a MIO line to a LIO line, wherein the memory device is configured to interpret the LIO precharge signal as an indication to charge the LIO line high;
receiving a read command;
performing a read operation in response to the read command; and
receiving an additional command without precharging the LIO line subsequent to performing the read operation and prior to receiving the additional command.

10. The method of claim 9, wherein performing the read operation comprises:
charging the LIO line high;
connecting the LIO line to a digit line to charge the LIO line based on a charge of the digit line, the digit line coupled to a memory cell of the memory device; and
connecting a main input/output (MIO) line to the LIO line to charge the MIO line based on a charge of the LIO line.

11. The method of claim 10, further comprising, in response to the read command:
disconnecting the LIO line from the digit line wherein the LIO line retains the charge of the LIO line for a duration of time following the disconnection of the LIO line from the digit line; and
disconnecting the MIO line from the LIO line.

12. The method of claim 11, further comprising, in response to the read command, charging the LIO line with a charge between high and low following the duration of time.

13. The method of claim 11, further comprising:
in response to the read command:
setting an equalize-control signal low prior to connecting the LIO line to the digit line, wherein the memory device is configured to interpret the equalize-control signal as an indication of whether the LIO line is to be charged with a charge between high and low, and wherein the LIO line; and
setting the equalize-control signal high after the duration of time.

14. The method of claim 11, further comprising:
in response to the read command:
setting an equalize-control signal low prior to connecting the LIO line to the digit line, wherein the memory device is configured to interpret the equalize-control signal as an indication of whether the LIO line is to be charged with a charge between high and low;
setting a column-select signal high, wherein the memory device is configured to interpret the column-select signal as an indication of whether the LIO line is to be connected to the digit line;
setting a read-state signal high, wherein the memory device is configured to interpret the read-state signal as an indication of whether the MIO line is to be connected to the LIO line;
setting the column-select signal low;
setting the read-state signal low; and
setting the equalize-control signal high.

15. The method of claim 11, further comprising:
in response to the read command:
charging a word line; and
discharging the word line.

16. A memory device, comprising:
circuitry configured to:
receive a write command; and
in response to the write command:
connect a main input/output (MIO) line to a local input/output (LIO) line to charge the LIO line based on a charge of the MIO line, the LIO line having a charge between high and low immediately prior to connecting the MIO line to the LIO line; and hold an LIO precharge signal low prior to connecting a MIO line to a LIO line, wherein the memory device is configured to interpret the LIO precharge signal as an indication to charge the LIO line high; and receive a read command, perform a read operation, and receive an additional command without precharging the LIO line subsequent to performing the read operation and prior to receiving the additional command.

17. The memory device of claim 16, wherein the circuitry is such that during a duration of time subsequent to the performance of the read operation and prior to the receipt of the additional command, the LIO line retains a charge based on a charge of a digit line, the digit line coupled to a memory cell of the memory device.

18. A system, comprising:
at least one input device;
at least one output device;
at least one processor device operably coupled to the input device and the output device; and
at least one memory device operably coupled to the at least one processor device and comprising:
circuitry configured to:
receive a write command;
in response to the write command, connect a main input/output (MIO) line to a local input/output (LIO) line to charge the LIO line based on a charge of the MIO line, the LIO line having a charge between high and low immediately prior to connecting the MIO line to the LIO line;
receive a read command;
perform a read operation in response to the read command; and
receive an additional command, wherein the LIO line is not precharged after the read operation and prior to receipt of the additional command.

19. The system of claim 18, wherein the circuitry is configured such that during a second duration of time subsequent to performance of the read operation and prior to receipt of the additional command, the LIO line retains a charge based on a charge of a digit line, the digit line coupled to a memory cell of the memory device.

* * * * *